(12) United States Patent
Miyazawa et al.

(10) Patent No.: US 8,133,404 B2
(45) Date of Patent: Mar. 13, 2012

(54) ELECTROMAGNETIC WAVE SHIELDING MATERIAL AND SHEET

(75) Inventors: Haruhiko Miyazawa, Tokyo (JP);
Haruyoshi Kakitani, Tokyo (JP);
Atsushi Toyota, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 158 days.

(21) Appl. No.: 12/528,875

(22) PCT Filed: Mar. 13, 2008

(86) PCT No.: PCT/US2008/056803
§ 371 (c)(1),
(2), (4) Date: Aug. 27, 2009

(87) PCT Pub. No.: WO2008/118645
PCT Pub. Date: Oct. 2, 2008

(65) Prior Publication Data
US 2010/0108956 A1 May 6, 2010

(30) Foreign Application Priority Data

Mar. 22, 2007 (JP) .................................. 2007-074801

(51) Int. Cl.
*G21F 1/08* (2006.01)
*G21F 1/10* (2006.01)
*H05K 9/00* (2006.01)
(52) U.S. Cl. .......... 252/62.51 R; 250/515.1; 439/607.02
(58) Field of Classification Search .................. 252/500, 252/511–514, 62.51 R; 250/515.1; 439/607.02
See application file for complete search history.

(56) References Cited

U.S. PATENT DOCUMENTS

| | | | |
|---|---|---|---|
| 6,310,355 B1 * | 10/2001 | Cadwalader | ............... 250/515.1 |
| 2005/0126807 A1 | 6/2005 | Warner et al. | |
| 2006/0045543 A1 | 3/2006 | Kato et al. | |
| 2006/0269695 A1 | 11/2006 | Daly et al. | |
| 2008/0067467 A1 | 3/2008 | Kato et al. | |
| 2008/0209876 A1 * | 9/2008 | Miller | .............................. 55/522 |
| 2009/0272946 A1 * | 11/2009 | Lu | .................................. 252/511 |

FOREIGN PATENT DOCUMENTS

| | | |
|---|---|---|
| EP | 1555242 A1 * | 7/2005 |
| JP | 1052302 A | 2/1989 |
| JP | 2006-73991 | 3/2006 |
| JP | 2006-128570 | 5/2006 |
| JP | 2007-27470 | 2/2007 |
| WO | WO 2004/069327 A2 | 8/2004 |
| WO | WO 2006/053083 A2 | 5/2006 |
| WO | WO 2006/132252 | 12/2006 |
| WO | WO 2008/055523 * | 5/2008 |

OTHER PUBLICATIONS

Maleki et al "High-Performance Carbon Composite Electrode based on an Ionic Liquid as a Binder", Analytical Chemistry, vol. 78, No. 11, Jun. 1, 2006 (3820-26).*

(Continued)

*Primary Examiner* — Mark Kopec
(74) *Attorney, Agent, or Firm* — James A. Baker; Melanie G. Gover

(57) ABSTRACT

An electromagnetic wave shielding material and a sheet using the same are described. Also described is a gel state electromagnetic wave shielding material including an ionic liquid, and fine particles capable of reflecting, suppressing or absorbing an electromagnetic wave suspended in the ionic liquid. The electromagnetic wave shielding material may provide both high electromagnetic interference shielding ability and flexibility when used in sheet form, and in some applications, may provide flame and heat resistance.

8 Claims, 2 Drawing Sheets

OTHER PUBLICATIONS

Altin et al., "First studies on the rheological behavior of suspensions in ionic liquids", *Chemical Engineering and Technology*, vol. 29, No. 11, Oct. 24, 2006, pp. 1347-1354.

Hayashi et al., "Discovery of a magnetic ionic liquid [bmim]FeCl$_4$", *Chemistry Letters, Chemical Society of Japan*, vol. 33, No. 12, Jan. 1, 2004, pp. 1590-1591.

Yoshida et al., "Influence of structural variation in 1-alklyl-3-methylimidazolium cation and tetrahalogenoferrate(III) anion on the physical properties of the paramagnetic ionic liquids", *Journal of Materials Chemistry, The Royal Society of Chemistry*, vol. 16, Jan. 9, 2006, pp. 1254-1262.

* cited by examiner

ELECTROMAGNETIC WAVE SHIELDING MATERIAL AND SHEET

CROSS REFERENCE TO RELATED APPLICATIONS

This application is a national stage filing under 35 U.S.C. 371 of PCT/US2008/056803, filed Mar. 13, 2008, which claims priority to Japan Application No.2007-074801, filed Mar. 22, 2007, the disclosure of which is incorporated by reference in its/their entirety herein.

TECHNICAL FIELD

The disclosure relates to an electromagnetic wave shielding material. More particularly, the disclosure relates to an electromagnetic wave shielding material comprising an ionic liquid, and a sheet made using the same.

BACKGROUND

In recent years, electronic communications devices have become increasingly smaller, and operating frequencies for electronic communications have become higher. As a result, it is desirable to provide effective electromagnetic wave shielding for electronic devices, so that an electronic device does not emit in excess of a permissible amount of electromagnetic interference (EMI), and does not receive external emissions of electromagnetic waves from another device. In addition, it is desirable that electromagnetic waves generated within an electronic device should be absorbed so as to prevent interference resulting from internally scattered electromagnetic waves. Furthermore, as wireless and mobile devices become increasingly pervasive, the necessity of suppressing EMI using an absorption material affixed to a surface, such as the wall in a building or a room, becomes increasing important to prevent reflection and interference of an electromagnetic wave at the surface.

Generally, it is desirable that an EMI shielding material, or an electromagnetic compatibility (EMC) material have, in addition to good EMI shielding performance, flexibility to facilitate mounting. In addition, it is desirable for the shielding material to be processed into a sheet for ease of handling and mounting. From such a perspective, an EMI shielding material including a material generating a conductive loss, a dielectric loss or a magnetic loss, such as metal and magnetic materials, dispersed in a resin material, may desirably be used as a shielding material. Furthermore, in order to increase EMI shielding performance, it is desirable that the shielding material include a high loading of fine filler particles in a resin material. However, the process of preparing a resin material with high filler loading of fine particles dispersed in a resin is not easy, and may also result in EMI shielding materials with reduced flexibility in some cases. Therefore, for the case of an EMI shielding sheet made using conventional resins and particulate material, it has been difficult to satisfy both the high flexibility and high EMI shielding requirements at the same time.

On the other hand, as described in Japanese Unexamined Patent Publication (Kokai) No. 64-52302 and Japanese Unexamined Patent Publication (Kokai) No. 2006-73991, there exists a technology for dispersing fine particles in a liquid medium having high dielectric constant, a liquid having an electric polarity, or an electrolyte solution, but not in a viscous resin. With respect to suitable solvent and electrolyte solutions, exemplary liquids include water, alcohols such as glycerin, methyl alcohol or ethanol, and aqueous halide solution such as aqueous sodium chloride solution or aqueous sodium iodide solution. These liquids may exhibit reduced efficacy in absorption of EMIs due to dielectric losses in the liquid, and some of the liquids may also be volatile and/or flammable. However, in processing these known materials into a sheet, it is desired to impart durability, flame resistance and heat resistance. In addition to these deficiencies, with respect to dispersion of fine particles in these liquids, only ferrite-based magnetic powders have been generally employed.

There are also examples wherein an ionic liquid is used as an EMI absorbing material. PCT Published Patent Application No. WO2006/053083 describes an EMI absorbing material wherein a polymerizable ionic liquid monomer is solidified by polymerization. PCT Published Patent Application No. WO2004/069327 describes an EMI shielding structure comprising two transparent window glass plates and an ionic liquid sealed between the transparent window glass plates. In such cases, EMI shielding was attempted using an ionic liquid, however, it is difficult to achieve adequate EMI shielding using only an ionic liquid. Furthermore, it has not previously been known to use fine particles of EMI absorbing materials in these ionic liquid materials, and it may be difficult to obtain a high loading of filler in solid materials due to their structure.

SUMMARY

In one aspect, the disclosure provides an EMI shielding material which may exhibit flame resistance and heat resistance and may achieve both a high level of shielding ability and high flexibility of the material when formed into a sheet.

In another aspect, the disclosure provides a gel state EMI shielding material comprising, in some embodiments, an ionic liquid, and fine particles capable of reflecting, suppressing or absorbing an EMI dispersed in the ionic liquid.

In a further aspect, the disclosure provides an EMI shielding sheet comprising the above EMI shielding material, and, in some embodiments, a protective structure which coats and seals the EMI shielding material, and holds it in a sheet form.

In some exemplary embodiments of the disclosure, the EMI shielding material comprises fine particles capable of reflecting, suppressing or absorbing an EMI (hereafter referred to as "EMI shielding fine particles") dispersed in an ionic liquid. In certain exemplary embodiments, it may be possible to obtain a synergistically high EMI shielding effect of EMI shielding fine particles and an ionic liquid. In other exemplary embodiments, the EMI shielding material comprises fine particle fillers in an ionic liquid, wherein the ionic liquid is gelled and is easy to handle, and further wherein the material is easily processed into a sheet material. In certain exemplary embodiments, the surface of the gelatinous EMI shielding material may be provided with a protective overlayer using, for example, a film material. In such embodiments, an EMI shielding sheet may be easily produced.

Certain features and advantages of certain exemplary embodiments of the disclosure may include the ability to achieve a high EMI shielding effect as described above, and the ability to achieve adequate EMI shielding using a comparatively thin, flexible film. Other exemplary embodiments may provide the advantage of using no volatile or flammable materials, thereby imparting improved flame and heat resistance to the EMI shielding material.

Various aspects and advantages of exemplary embodiments of the disclosure have been summarized. The above Summary is not intended to describe each illustrated embodiment or every implementation of the present invention. The Drawings and the Detailed Description that follow more particularly exemplify certain preferred embodiments using the principles disclosed herein.

DETAILED DESCRIPTION

Figure 1:
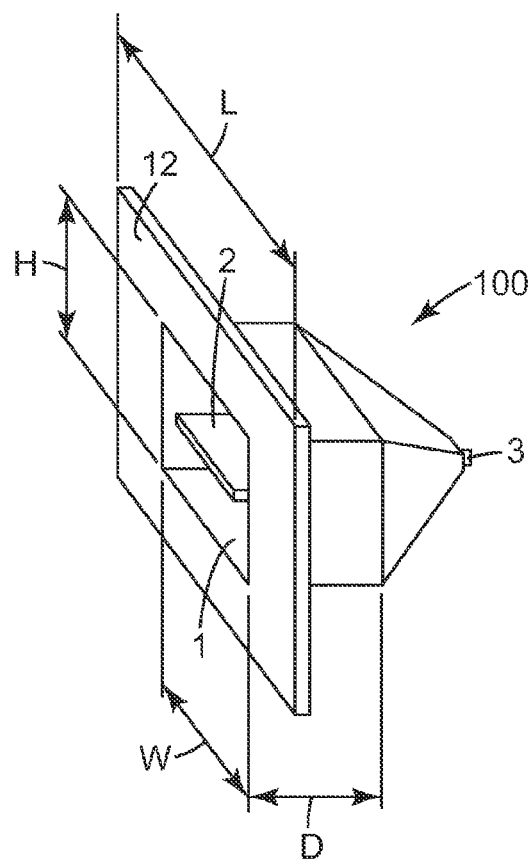
FIG. 1 is a perspective view showing a shield box for an apparatus for measuring an EMI shielding effect used in evaluating certain embodiments of the disclosure.

Various exemplary embodiments of the disclosure will now be described with particular reference to the Drawings. Exemplary embodiments of the invention may take on various modifications and alterations without departing from the spirit and scope of the disclosure. Accordingly, it is to be understood that the embodiments of the invention are not to be limited to the following described exemplary embodiments, but is to be controlled by the limitations set forth in the claims and any equivalents thereof.

One exemplary EMI shielding material of the present disclosure is a gel state material containing an ionic liquid and EMI shielding fine particles dispersed in the ionic liquid. Throughout this specification, the term "ionic liquid" means a salt in liquid form, the salt comprising at least one cation and at least one anion. The cation and the anion in the ionic liquid are positively and negatively charged, respectively, and therefore may absorb an EMI and exert an EMI shielding effect.

In some exemplary embodiments, the ionic liquid comprises a low melting point organic salt having a low melting point, typically 100° C. or lower. In certain exemplary embodiments, the salt preferably remains in a liquid state under the temperature conditions of use, for example, at room temperature (for example, about 25° C.). Such salts are also referred to herein as "normal temperature molten salts." In certain exemplary embodiments, the ionic liquids are highly stable, both thermally and chemically, and in some exemplary embodiments, are nonvolatile, so that the resulting EMI shielding material may be imparted with flame and heat resistance.

With respect to exemplary ionic liquids, known ionic liquids may be used. Examples of suitable cations, which may combined with one or more of the following anions to form an ionic liquid, include primary ($R_1NH_3^+$), secondary ($R_1R_2NH_2^+$), tertiary ($R_1R_2R_3NH^+$) and quaternary ($R_1R_2R_3R_4N^+$) chain ammonium cations (wherein $R_1$, $R_2$, $R_3$ and $R_4$ independently represent an alkyl or phenyl group having 1 to 12 carbon atoms) and cyclic ammonium cation. Examples of the cyclic ammonium cation include oxazolium, thiazolium, imidazolium, pyrazolium, pyrolinium, furazanium, triazolium, pyrolidinium, imidazolidinium, pyrazolidinium, pyrolinium, imidazolinium, pyrazolinium, pyridinium, pyradinium, pyrimidinium, pyridazinium, piperidinium, piperazinium, morphorinium, indolium and carbazolium.

Other exemplary cations include chain phosphonium cation ($R_5R_6R_7P^+$ and $R_5R_6R_7R_8P^+$), chain sulfonium cation ($R_9R_{10}R_{11}S^+$) (wherein $R_5$, $R_6$, $R_7$, $R_8$, $R_9$, $R_{10}$ and $R_{11}$ independently represent an alkyl or phenyl group having 1 to 12 carbon atoms) and cyclic sulfonium cation. Examples of the cyclic sulfonium cation include thiophenium and thiopyranium.

Examples of suitable anions, which may combined with one or more of the above cations to form an ionic liquid, include phosphate ($PO_4^{3-}$, $R_{12}PO_4^{2-}$, $R_{12}R_{13}PO_4^-$), phosphonate ($R_{12}PO_3^{2-}$, $R_{12}R_{13}PO_3^-$), phosphinate ($R_{12}R_{13}PO_2^-$) and borate ($BO_3^{3-}$, $R_{12}BO_3^{2-}$, $R_{12}R_{13}BO_3^-$) ($R_{12}$ and $R_{13}$ independently represent hydrogen or an alkyl or phenyl group having 1 to 4 carbon atoms).

Examples of a further anion, which is combined with the above cation to form an ionic liquid, include tetrafluoroborate ($BF_4^-$), hexafluorophosphate ($PF_6^-$), hexafluoroarsenate ($AsF_6^-$), trifluoromethylsulfonate ($CF_3SO_3^-$), bis(fluorosulfonyl)imide [$(FSO_2)_2N^-$], bis(trifluoromethylsulfonyl)imide [$(CF_3SO_2)_2N^-$], bis(trifluoroethylsulfonyl)imide [$(CF_3CF_2SO_2)_2N^-$] and tris(trifluoromethylsulfonylmethide [$(CF_3SO_2)_3C^-$].

In some exemplary embodiments, particulate fillers may be added to the ionic liquid to increase the EMI shielding effect. In certain exemplary embodiments, addition of fine particles to the ionic liquid may gel the ionic liquid, or cause it to become quasi-solidified (e.g. gelled). Examples of suitable EMI shielding particles include carbon fine particles and known conductive, dielectric or magnetic fine particles. Exemplary conductive fine particles include, for example, metal particles such as Al, Fe, Ni, Cr, Cu, Au and Ag, alloys thereof, and combinations thereof. Exemplary carbon fine particles include, for example, carbon black, carbon fiber, carbon nanotube, fullerene and diamond can be used. Exemplary dielectric fine particles include, for example, fine particles of $SiO_2$, $Al_2O_3$, barium titanate and titanium oxide, and combinations thereof. Exemplary magnetic fine particles include, for example, fine particles of metal alloys and metal oxides containing a transition element such as magnetite ($Fe_3O_4$), permalloy (Fe—Ni) and sendust (Al—Si—Ni), and combinations thereof.

In certain embodiments, a single kind of fine particles may be added, or a mixture of more than one kind of fine particles may used. The added fine particles may absorb, suppress or reflect an EMI, thereby making it possible to exert the EMI shielding effect. Accordingly, the EMI shielding material of the present disclosure can exert the higher EMI shielding effect by the synergic effect with the ionic liquid. In some embodiments, the fine particles are well dispersed in the ionic liquid so that electrical double-layers form around the particles, thereby suppressing the tendency of the fine particles to aggregate, and resulting, in some embodiments, in good dispersibility and dispersion stability of the fine particles.

In certain exemplary embodiments, the size of the fine particles is preferably 1 nm or more, and 100 μm or less in terms of a number average particle size. The number average particle size of the fine particles can be measured, for example, by using a scanning electron microscope (SEM) or a transmission electron microscope (TEM), or using dynamic light scattering (DLS).

Generally, when the size of fine particles becomes smaller and the surface area of fine particles increases, gelation may be caused by adding a small amount of fine particles to an ionic liquid. Therefore, in some embodiments, in order to more easily gel the ionic liquid, it may be preferable that the size of the fine particles be selected or adjusted to, for example, 10 μm or less, more preferably 1 μm or less in diameter. In some embodiments, gelation may be achieved by using fibrous fine particles. On the other hand, since the fine particles themselves have an electromagnetic shielding effect, it is sometimes preferable to increase the filler loading of the fine particles. In such exemplary embodiments, it may be preferable to use relatively larger particles (at least 1 µm, more preferably 10 µm or more in diameter) as long as the ionic liquid is not separated.

Various shapes and physical forms of the fine particles may be selected, including, for example, spheres, rods, platelets and acicular fibers. In certain exemplary embodiments, the size of the fine particles refers to a maximum size that passes through the center of gravity or mass of the particle. For example, for the case of fine particles in rod form, a maximum size in the fiber base, such as a diameter of the rod's bottom, and the rod height may be compared, and the longer size may be taken as the size of the fine particles, while for the case of a platelet form, a maximum size of the platelet surface may be taken, and likewise, for the case of an acicular fiber form, a length of the fiber may be taken as the size of the fine particles.

As described above, in some exemplary embodiments, as the amount of the EMI shielding fine particles in the ionic liquid is increased, the EMI shielding performance can preferably be enhanced. However, when the amount of the EMI shielding fine particles is too large, it may become difficult to process the resulting EMI shielding material into a sheet, and the mechanical strength and the flexibility tend to be lost. On the other hand, when the amount of the EMI shielding fine particles is too small, the EMI shielding effect decreases and gelation of the EMI shielding material does not occur, and thus it becomes impossible to process into a sheet and the ionic liquid may tend to ooze from the EMI shielding sheet.

From such a perspective, although the amount of the EMI shielding fine particles in the ionic liquid is not particularly limited, in some exemplary embodiments, the amount is preferably from 5 to 90% by mass based on the mass of the EMI shielding material containing the EMI shielding fine particles and the ionic liquid. In certain exemplary embodiments, the amount of EMI shielding fine particles is preferably 10% by mass or more, more preferably 20% by mass or more; and preferably 80% by mass or less, more preferably 50% by mass or less.

In some exemplary embodiments, the EMI shielding material of the present disclosure may be gelled by filling the EMI shielding fine particles in the ionic liquid. A gel state means a highly viscous state as a result of loss of fluidity. In some embodiments, the gel state may correspond to formation of an elastic solid, or a liquid with an elastic modulus sufficiently large that it effectively behaves as a solid. As used herein, the term "loss of fluidity" means the state where liquid flow-out does not occur or hardly occurs when the EMI shielding material described hereinafter is coated on a substrate. In some exemplary embodiments of a gelled EMI shielding material, flow-out is suppressed and the shape can be maintained. Accordingly, it may become easier to conduct any processing of the EMI shielding material, which may include lamination to form multilayer sheets or films.

In certain exemplary embodiments, the EMI shielding material is in a gel state and therefore can be coated on various base materials and placed into sealed containers, for example a bag, having various shapes. For example, the EMI shielding material can also be processed into a sheet by providing with a protective structure capable of coating and sealing the EMI shielding material and holding it in a sheet form.

One exemplary method of producing an electromagnetic shielding material and the method of processing it into a sheet will now be described. First, an ionic liquid and EMI shielding fine particles are mixed in an adequate ratio and stirred to form an EMI shielding material. At this time, a kneader such as, for example, a ball mill could be used for mixing and stirring, but an ionic liquid can generally, by its nature, be well mixed with fine particles, thereby dispersing the fine particles to obtain a gel state composition. Therefore, in some exemplary embodiments, without using a special kneader, the EMI shielding material can be obtained at room temperature. In other exemplary embodiments, when the melting point of the ionic liquid is higher than room temperature, the ionic liquid may be heated to the temperature higher than the melting point, thereby liquefying it, followed by mixing with the fine particles.

Then, one or more flexible films, for example, plastic or polymeric films, may be provided, and the EMI shielding material gel prepared as described above may be interposed between one or more films so that the resulting multilayer film construction has a predetermined thickness, thus forming an EMI shielding sheet. In order to interpose the EMI shielding material between two films, for example, one film may be coated using a casting or screen printing method and then another film may be laminated to the first film. The thickness of the flexible film may be appropriately selected according to the flexibility required by the obtained EMI shield sheet and is not specifically limited and may be, for example, from about 10 to 2,000 µm. The thickness of the gel is not particularly limited, and may be appropriately selected according to the required properties of the EMI shielding material, for example, from about 5 to about 1,000 µm.

Non-limiting examples of suitable flexible films include, but are not limited to, resin films formed of polyethylene, polypropylene, vinyl chloride, polycarbonate, thermoplastic polyurethane, cellophane (trademark), poly(vinylidene fluoride), polyethylene phthalate (PET), polystyrene, poly(vinylidene chloride), acryl-based resin, polyurethane-based resin, polyolefin-based resin, fluorine-based resin (including PVdF, ETFE), polyimide resin, phenol resin, epoxy resin, polyamide and polyphenylene ether.

In addition, in certain exemplary embodiments, it is not necessary to form a sheet by lamination of one or more flexible films. For example, especially when a thin sheet is required, the surface of the sheet made of an electromagnetic shielding material is provided with a protective structure, thereby preventing oozing of the ionic liquid, and thus an EMI shielding sheet may be produced. As one exemplary protective structure, it may be desirable to form a thin polymer protective film on the surface of the sheet made of the electromagnetic shielding material.

In an exemplary embodiment, a polymerizable compound such as an ultraviolet radiation polymerizable monomer may be coated on two base materials subjected to a release treatment (for example, polyethylene terephthalate (PET) film subjected to a release treatment) and the gel state EMI shielding material is interposed between base material so that these base materials are laid one upon another so that the side coated with the polymerizable compound faces with each other so as to adjust the gel state EMI shielding material to predetermined thickness, followed by polymerization of the polymerizable compound through irradiation with ultraviolet rays, or other sources of actinic radiation.

Then, the base material subjected to a release treatment may be removed to obtain a sheet made of an EMI shielding material comprising a polymer protective film on the surface. Alternatively, in certain exemplary embodiments, a gel state electromagnetic shielding material may be coated on a resin film to form an EMI shielding layer. On the surface of the EMI shielding layer, a photopolymerizable protective film may be directly formed using a spray method, and then the protective film may be polymerized by irradiation with ultraviolet radiation and thereby solidified.

In some exemplary embodiments, the EMI shielding material of the present disclosure can also contain, in addition to the ionic liquid and the EMI shielding particles, antioxidants, ultraviolet reflection agents, antifoamers, pigments, dispersants, and other additives as necessary.

EXAMPLES

Exemplary embodiments of the present invention have been described above and are further illustrated below by way of the following Examples, which are not to be construed in any way as imposing limitations upon the scope of the present invention. On the contrary, it is to be clearly understood that resort may be had to various other embodiments, modifications, and equivalents thereof which, after reading the description herein, may suggest themselves to those skilled in the art without departing from the spirit of the present disclosure and/or the scope of the appended claims. Furthermore, notwithstanding that the numerical ranges and parameters setting forth the broad scope of the disclosure are approximations, the numerical values set forth in the specific examples are reported as precisely as possible. Any numerical value, however, inherently contain certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Example 1

A sheet of an EMI shielding material, which contains dielectric fine particles, $SiO_2$ particles in an ionic liquid, was produced by the following procedure.

To 8.0 g of an ionic liquid (EMI-$BF_4$) (1-ethyl-3-methylimidazolium tetrafluoroborate, manufactured by KANTO CHEMICALS, Tokyo, Japan) of the following formula (1):

Chemical Formula 1

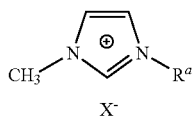

(I)

wherein $R^a$ represents ethyl and $X^-$ represents $BF_4^-$, 4.5 g of $SiO_2$ particles [Aerosil 200 (trade name) with 12 nm in diameter, manufactured by NIPPON AEROSIL, Tokyo, Japan] was added, followed by mixing until the ionic liquid is completely gelled. Without using a kneader such as ball mill, the ionic liquid was gelled in few minutes by mixing with a spatula.

Then, the gel was coated on a 50 μm thick polyethylene terephthalate (PET) film subjected to a release treatment (SP50, manufactured by PANAC CO. LTC, Tokyo, Japan) using a knife coater to form a gel layer. The gel layer was laminated with a 38 μm thickness polyethylene terephthalate film (A31 manufactured by DUPONT TEIJIN FILMS, Tokyo, Japan) to obtain an EMI shielding sheet. The thickness of the gel layer was adjusted to be approximately 500 μm.

The prepared EMI shielding sheet was cut into a size of 100 mm×30 mm and was taken as a measurement sample.

Example 2

In the same manner as in Example 1, a measurement sample was prepared, except for replacing 4.5 g of $SiO_2$ by 3.5 g of conductive fine particles, carbon black (#303CB, having a particle size of 55 nm in diameter, and manufactured by MITSUBISHI CHEMICAL LTD., Tokyo, Japan) to form a sheet of an EMI shielding material.

Example 3

In the same manner as in Example 1, a measurement sample was prepared, except for replacing 4.5 g of $SiO_2$ by 1.2 g of conductive fine particles, carbon fiber (VGCF, having a particle size of 150 nm in diameter and a length of less than approx. 1 μm, and manufactured by SHOWA DENKO K.K., Tokyo, Japan) to form a sheet of an EMI shielding material.

Example 4

In the same manner as in Example 1, a measurement sample was prepared, except for replacing 4.5 g of $SiO_2$ by 10 g of magnetic fine particles, $Fe_3O_4$ particles (FE007PB, having a particle size of less than 1 μm in diameter, and manufactured by KOUJYUNDO CHEMICAL LABORATORY, Tokyo, Japan) to form a sheet of an EMI shielding material.

Example 5

In the same manner as in Example 1, a measurement sample was prepared, except for replacing 4.5 g of $SiO_2$ by 55 g of magnetic fine particles, Fe—Ni (PERMALLOY) alloy fine particles (50% Fe-50% Ni having a particle size of 10 μm in diameter, and manufactured by EPSON ATOMIC LTD., Tokyo, Japan) to form a sheet of an EMI shielding material.

Example 6

As an ionic liquid, PX-4 $H_2PO_4$ (tetrabutylphosphonium phosphate) was used. The ionic liquid was prepared by the following method. 17.5 g of an aqueous 85 wt % solution of phosphoric acid (manufactured by SIGMA-ALDRICH CHEMICAL CO., Tokyo, Japan) was added dropwise to 100 g of an aqueous 40 wt % of aqueous PX-4 (tetrabutylphosphonium hydroxide solution manufactured by SIGMA-ALDRICH CHEMICAL CO., Tokyo, Japan) under ice cooling. The obtained mixture was concentrated by using a rotary evaporator, followed by extraction from methylene chloride. The methylene chloride layer was dehydrated over magnesium sulfate and the methylene chloride was concentrated by using a rotary evaporator, followed by drying under reduced pressure at 60° C. to obtain 41 g of PX-4 $H_2PO_4$ in the form of a transparent, colorless and viscous liquid. 7.1 g of dielectric fine particles, $Al_2O_3$ (having a particle size of 31 nm in diameter, and manufactured by C. I. KASEI, Tokyo, Japan) were mixed with 8.0 g of PX-4 $H_2PO_4$, and then a sheet of an EMI shielding material and the sample were produced under the same conditions as in Example 1.

Electromagnetic shielding properties (electric field shielding effect) of the samples prepared in Examples 1 to 6 were measured by a KEC method described hereinafter. The KEC method is a measurement method developed by KANSAI ELECTRONIC INDUSTRY DEVELOPMENT CENTER. The measurement method will be described with reference to FIGS. 1 and 2. First, two shield boxes 100 are provided, each shield box 100 having a faceplate 12 of length L defining an internal cavity 1 of depth D having a rectangular cross section measuring 80 mm in width (W)×100 mm in height (H). In the cavity 1, a central conductor 2 is disposed, and a tapered pyramidal structure is formed in one side of each shield box 100 in communication with the cavity 1. There is provided an input/output portion 3 at the end of each tapered pyramidal structure.

Figure 2:
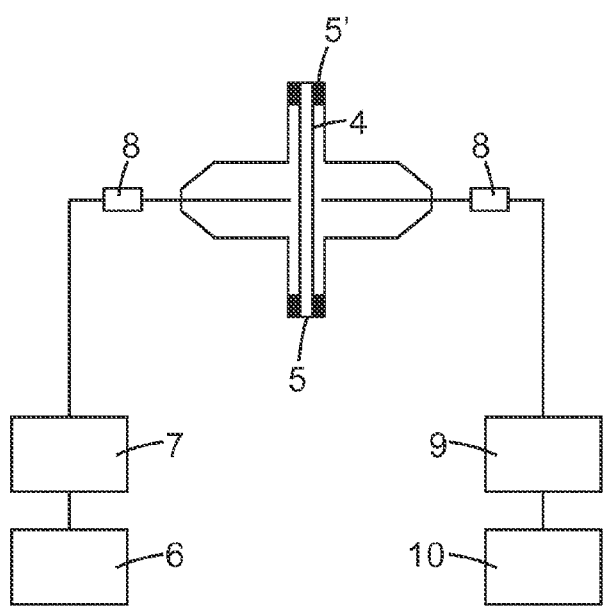
FIG. 2 shows a configuration of an apparatus for measuring an EMI shielding effect used in evaluating certain embodiments of the disclosure.

As shown in FIG. 2, the two shield boxes are disposed so that the openings face each other. A sample 4 is disposed between each faceplate 12 of the two shield boxes 100, compressed and sealed through EMI gaskets 5-5'. Electromagnetic waves are generated by a signal generator 6, and the power level is adjusted by using a RF power amplifier 7 and an attenuator 7, transmitted to the input/output portion 3 and then oscillated from one of the central conductor 2 to the sample 4. The EMI passing through the sample 4 is transmitted from the other central conductor 2 placed opposite through the input/output portion 3, and the level is adjusted by the attenuator 8 and a RF pre-amplifier 9 and is detected by a spectrum analyzer 10 as a received frequency (received level). Incidentally, the details of the measurement by the KEC method can be referred to a known document (E. Hariya and M. Umano, "Instruments for measuring the electromagnetic shielding effect" Electromagnetic Compatibility Tokyo vol. 11 pp 800-805, 1984).

The shielding effect (SE) was determined using the following formula:

$$SE(dB) = 20\log E1 - 20\log E2$$

where E1 denotes a received level when the sample 4 does not exist, while E2 denotes a received level when the sample 4 exists.

Figure 3:
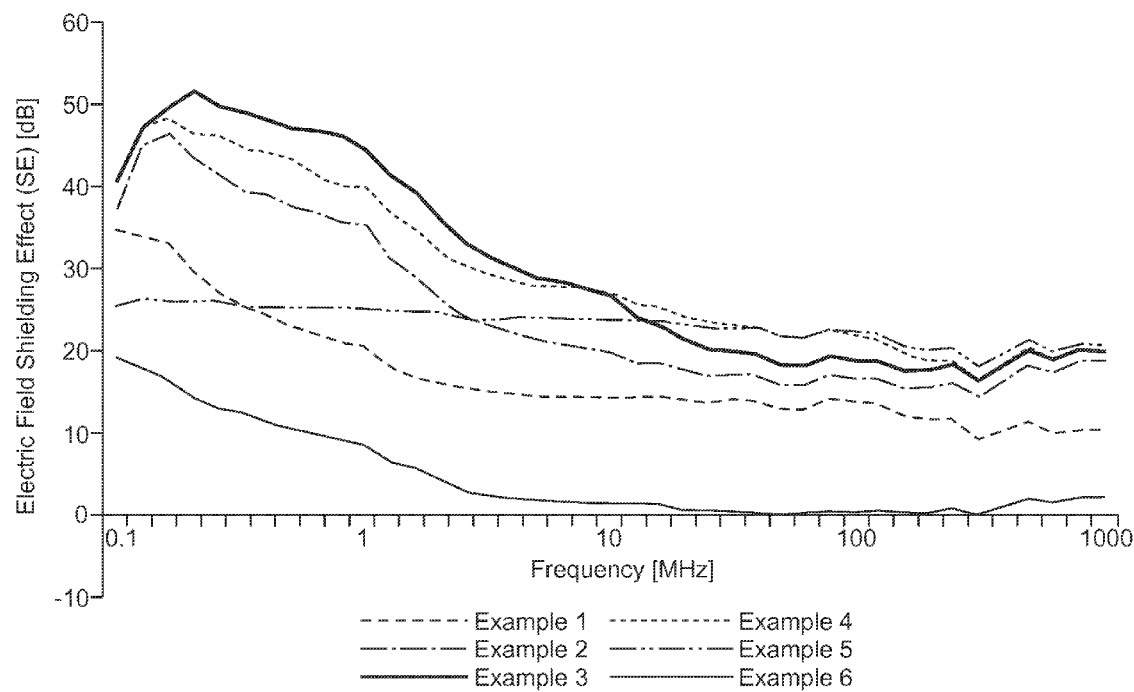
FIG. 3 is a graph showing a plot of frequency versus electric field shielding effect according to certain exemplary embodiments of the disclosure.

The electric field shielding effect was measured by using a measuring device as shown in FIG. 2, and the results of the measurements are shown in FIG. 3. In the graph of FIG. 3 the abscissa shows a frequency and the ordinate shows an electric field shielding effect (SE) as calculated according to the above equation. As is apparent from the graph, Examples 1 to 6 each exhibit an EMI shielding effect. In particular, when carbon and magnetic fine particles were used as fine particle fillers in an ionic liquid, a higher EMI shielding effect was observed over a wider frequency range as compared with the case where $SiO_2$ and $Al_2O_3$ were used.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g. 1 to 5 includes 1, 1.5, 2, 2.75, 3, 3.80, 4, and 5). In addition, all numbers used herein are assumed to be modified by the term 'about'. Various exemplary embodiments have been described. These and other embodiments are within the scope of the following claims.

The invention claimed is:

1. A gel state electromagnetic wave shielding material comprising an ionic liquid containing an anion selected from the group consisting of phosphate, phosphonate, phosphinate, and borate, and an effective amount of magnetic fine particles dispersed in the ionic liquid to render the gel state material sufficiently solid to be formed permanently into a sheet.

2. The electromagnetic wave shielding material according to claim 1, wherein the magnetic fine particles are contained in an amount of 5 to 90% by mass based on the mass of the electromagnetic wave shielding material.

3. The electromagnetic wave shielding material according to claim 1, wherein the ionic liquid is a salt consisting only of a cation and an anion and is liquid at 25° C.

4. The electromagnetic wave shielding material according to claim 1, further comprising fine particles selected from conductive and dielectric particles.

5. The electromagnetic wave shielding material according to claim 4, wherein the ionic liquid is a salt consisting only of a cation and an anion and is liquid at 25° C.

6. The electromagnetic wave shielding material according to claim 1, wherein the fine particles are contained in an amount of 5 to 90% by mass based on the mass of the electromagnetic wave shielding material.

7. The electromagnetic wave shielding material according to claim 4, wherein the size of the fine particles is 100 µm or less in terms of a number average particle size.

8. The electromagnetic wave shielding material according to claim 7, wherein the electromagnetic wave shielding fine particles are contained in an amount of 5 to 90% by mass based on the mass of the electromagnetic wave shielding material.

* * * * *

UNITED STATES PATENT AND TRADEMARK OFFICE
CERTIFICATE OF CORRECTION

| | | |
|---|---|---|
| PATENT NO. | : 8,133,404 B2 | Page 1 of 1 |
| APPLICATION NO. | : 12/528875 | |
| DATED | : March 13, 2012 | |
| INVENTOR(S) | : Haruhiko Miyazawa | |

It is certified that error appears in the above-identified patent and that said Letters Patent is hereby corrected as shown below:

<u>Title Page (second page), col. 2, line 1</u>
Item [56], References Cited, OTHER PUBLICATIONS, delete "alklyl" and insert
-- alkyl --, therefore.

<u>Column 3</u>
Line 58, delete "pyrolinium," and insert -- pyrrolinium, --, therefore.
Line 59, delete "pyrolidinium," and insert -- pyrrolidinium, --, therefore.
Line 62, delete "morphorinium" and insert -- morpholinium, --, therefore.

<u>Column 10</u>
Line 44, Claim 7, delete "claim 4" and insert -- claim 1 --, therefore.

Signed and Sealed this
Seventeenth Day of July, 2012

David J. Kappos
*Director of the United States Patent and Trademark Office*